US008872679B1

United States Patent
Roberts et al.

(10) Patent No.: US 8,872,679 B1
(45) Date of Patent: Oct. 28, 2014

(54) SYSTEM AND METHOD FOR DATA COMPRESSION USING MULTIPLE SMALL ENCODING TABLES

(71) Applicant: Teradata Corporation, Dayton, OH (US)

(72) Inventors: Gary Roberts, Carlsbad, CA (US); Guilian Wang, San Diego, CA (US)

(73) Assignee: Teradata US, Inc., Dayton, OH (US)

( * ) Notice: Subject to any disclaimer, the term of this patent is extended or adjusted under 35 U.S.C. 154(b) by 23 days.

(21) Appl. No.: 13/705,217

(22) Filed: Dec. 5, 2012

(51) Int. Cl.
H03M 7/00 (2006.01)
H03M 7/42 (2006.01)

(52) U.S. Cl.
CPC .................................. H03M 7/42 (2013.01)
USPC .......................................... 341/106; 341/51

(58) Field of Classification Search
CPC ........ H03M 7/30; H03M 7/40; H03M 7/6076
USPC .......................... 341/51, 65, 67, 87, 106, 107
See application file for complete search history.

(56) References Cited

U.S. PATENT DOCUMENTS

| 6,426,711 | B1* | 7/2002 | Cooper | 341/87 |
| 6,614,368 | B1* | 9/2003 | Cooper | 341/51 |
| 8,400,335 | B2* | 3/2013 | Jaquette | 341/51 |
| 8,643,515 | B2* | 2/2014 | Cideciyan | 341/65 |

* cited by examiner

Primary Examiner — Brian Young
(74) Attorney, Agent, or Firm — James Stover

(57) ABSTRACT

A system and method for compressing and decompressing multiple types of character data. The system and method employ multiple encoding tables, each designed for encoding a subset of character data, such as numeric data, uppercase letters, lowercase letters, Latin, or UNICODE data, to perform compressions and decompression of character data, and. The compression solution also provides for the creation of new encoding tables on the fly, and accommodates the compression of lengthy character streams using multiple different general compression algorithms, automatically choosing a suitable general compression algorithm for specific input data.

9 Claims, 9 Drawing Sheets

FIG. 2

Sample Encoding Tables

| Encoding Table ID | Table ID Bits | Table ID Representation | Table Name | Elements | Element Bits |
|---|---|---|---|---|---|
| 0 | 4 | 0000 (0x00) | Digits | 0~9 | 4 |
| 1 | 4 | 0001 (0x01) | Uppercase English letters | A~Z | 5 |
| 2 | 4 | 0010 (0x02) | Lowercase English letters | a~z | 5 |
| 3 | 4 | 0011 (0x03) | English letters | A~Za~z | 6 |
| 4 | 4 | 0100 (0x04) | Latin | U+0000~00FF | 8 |
| 5 | 4 | 0101 (0x05) | Unicode | U+0000~FFFF | 16 |
| 6 | 4 | 0110 (0x06) | Quoting Latin | U+0000~00FF | 8 |
| 7 | 4 | 0111 (0x07) | Quoting general punctuations & symbols | U+2000~20FF | 8 |
| 8 | 5 | 10000 (0x10) | Quoting Unicode | U+0000~FFFF | 16 |
| 9* | 5 | 10001 (0x11) | Greek, Combining diacritical marks | U+0300~03FF | 8 |
| 10* | 5 | 10010 (0x12) | Cyrillic | U+0400~04FF | 8 |
| 11* | 5 | 10011 (0x13) | Hebrew | U+0590~05FF | 7 |
| 12* | 5 | 10100 (0x14) | Arabic | U+0600~06FF | 8 |
| 13* | 5 | 10101 (0x15) | Thai, Lao | U+0E00~0EFF | 8 |
| 14* | 5 | 10110 (0x16) | CJK symbols and punctuation, Hiragana, Katakana (CJKHK) | U+3000~30FF | 8 |
| 15 | 5 | 10111 (0x17) | Reserved for future use | | 8 |
| 16 | 5 | 11000 (0x18) | Reserved for future use | | 8 |
| 17 | 5 | 11001 (0x19) | Reserved for future use | | 8 |
| 18 | 5 | 11010 (0x1A) | Reserved for future use | | 8 |
| 19 | 5 | 11011 (0x1B) | Reserved for future use | | 8 |
| 20 | 5 | 11100 (0x1C) | Reserved for future use | | 8 |
| 21 | 5 | 11101 (0x1D) | Reserved for future use | | 8 |
| 22 | 5 | 11110 (0x1E) | Definable tables | 0x00~0xFF (256 Unicode blocks) | 8 |
| 23 | 5 | 11111 (0x1F) | Definable algorithms | 0x00~0x0F (16 algorithms e.g., 0 for ZLIB etc.) | 8 |

TABLE ID 0

| CHARACTER | BITS | VALUE |
|---|---|---|
| 0 | 0000 | 0x00 |
| 1 | 0001 | 0x01 |
| 2 | 0010 | 0x02 |
| 3 | 0011 | 0x03 |
| 4 | 0100 | 0x04 |
| 5 | 0101 | 0x05 |
| 6 | 0110 | 0x06 |
| 7 | 0111 | 0x07 |
| 8 | 1000 | 0x08 |
| 9 | 1001 | 0x09 |
| space | 1010 | 0x0A |
| - | 1011 | 0x0B |
| . | 1100 | 0x0C |
| / | 1101 | 0x0D |
| : | 1110 | 0x0E |
| TABLE STOP INDICATOR | 1111 | 0x0F |

FIG. 3A

| CHARACTER | BITS | VALUE |
|---|---|---|
| A | 00000 | 0x00 |
| B | 00001 | 0x01 |
| C | 00010 | 0x02 |
| D | 00011 | 0x03 |
| E | 00100 | 0x04 |
| F | 00101 | 0x05 |
| ⋮ | ⋮ | |
| Y | 10000 | 0x18 |
| Z | 11001 | 0x19 |
| space | 11010 | 0x1A |
| - | 11011 | 0x1B |
| . | 11100 | 0x1C |
| / | 11101 | 0x1D |
| : | 11110 | 0x1E |
| Table Stop Indicator | 11111 | 0x1F |

TABLE ID 1

FIG. 3B

| CHARACTER | BITS | VALUE |
|---|---|---|
| a | 00000 | 0x00 |
| b | 00001 | 0x01 |
| c | 00010 | 0x02 |
| d | 00011 | 0x03 |
| e | 00100 | 0x04 |
| f | 00101 | 0x05 |
| ⋮ | ⋮ | |
| y | 10000 | 0x18 |
| z | 11001 | 0x19 |
| space | 11010 | 0x1A |
| - | 11011 | 0x1B |
| . | 11100 | 0x1C |
| / | 11101 | 0x1D |
| : | 11110 | 0x1E |
| Table Stop Indicator | 11111 | 0x1F |

| Examples | Characters | Latin | UTF-16 | UTF-8 | ZLIB | SCSU | CAMSET | ECAMSET |
|---|---|---|---|---|---|---|---|---|
| 1. US-ASCII | 13 | 13 | 26 | 13 | 31 | 13 | 9 | 9 |
| 2. German | 9 | 9 | 18 | 11 | 25 | 9 | 15 | 9 |
| 3. Cyrillic | 19 | NA | 38 | 28 | 41 | 22 | 33 | 21 |
| 4. Japanese | 116 | NA | 232 | 348 | 201 | 178 | 233 | 171 |

FIG. 6A

SYSTEM AND METHOD FOR DATA COMPRESSION USING MULTIPLE SMALL ENCODING TABLES

CROSS REFERENCE TO RELATED APPLICATIONS

This application is related to the following co-pending and commonly-assigned patent application, which is incorporated herein by reference:

Patent application Ser. No. 13/414,768, entitled "SYSTEM AND METHOD FOR DATA COMPRESSION USING MULTIPLE ENCODING TABLES" by Gary Roberts, Guilian Wang, and Fred Kaufmann; filed on Mar. 8, 2012. Patent application Ser. No. 13/414,768 claims priority to Provisional Patent Application Ser. No. 61/580,928, filed on Dec. 28, 2011.

FIELD OF THE INVENTION

The present invention relates to methods and systems for compressing electronic data for storage or transmission; and in particular to an improved method and system for lossless data compression utilizing multiple encoding tables and leveraging different compression algorithms to achieve improved compression performance results for both short and long data streams.

BACKGROUND OF THE INVENTION

The amount of data generated, collected and saved by businesses is increasing at an unprecedented rate. Businesses are retaining enormous amounts of detailed data, such as call detail records, transaction history, and web clickstreams, and then mining it to identify business value. Regulatory and legal retention requirements are requiring businesses to maintain years of accessible historical data.

As businesses enter an era of petabyte-scale data warehouses, advanced technologies, such as data compression are increasingly utilized to effectively maintain enormous data volumes in the warehouse. Data compression reduces storage cost by storing more logical data per unit of physical capacity. Performance is improved because there is less physical data to retrieve during database queries.

Currently, most of database systems provide compression features. For example, database systems provided by Teradata Corporation support block level compression (BLC), multi-value compression (MVC) and algorithmic compression (ALC) controlled at the column level. There exist various compression algorithms that can be used for BLC and ALC, but different compression algorithms usually have dramatically different compression capabilities on data with different characteristics. Determining which compression algorithm to use for a particular data type or situation is a very common problem for database providers and users, often requiring a significant amount of manual effort to make the best choice of compression algorithm.

Described below is an improved method and system for data compression utilizing multiple encoding tables and leveraging different compression algorithms to achieve improved compression performance results for both short and long data streams.

BRIEF DESCRIPTION OF THE DRAWINGS

FIG. 2 is a table identifying encoding tables and compression algorithms for use in compressing data in accordance with the present invention.

FIG. 3A provides an example Digits encoding table, identified as Encoding Table ID 0 in the table of FIG. 2, for use in compressing numeric data in accordance with the present invention.

FIG. 3B provides an example Uppercase English letters encoding table, identified as Encoding Table ID 1 in the table of FIG. 2, for use in compressing uppercase alphabetic data in accordance with the present invention.

FIG. 6A is a table summarizing the results of several compression examples utilizing the compression techniques of the present invention.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable one of ordinary skill in the art to practice the invention, and it is to be understood that other embodiments may be utilized and that structural, logical, optical, and electrical changes may be made without departing from the scope of the present invention. The following description is, therefore, not to be taken in a limited sense, and the scope of the present invention is defined by the appended claims.

Figure 1:
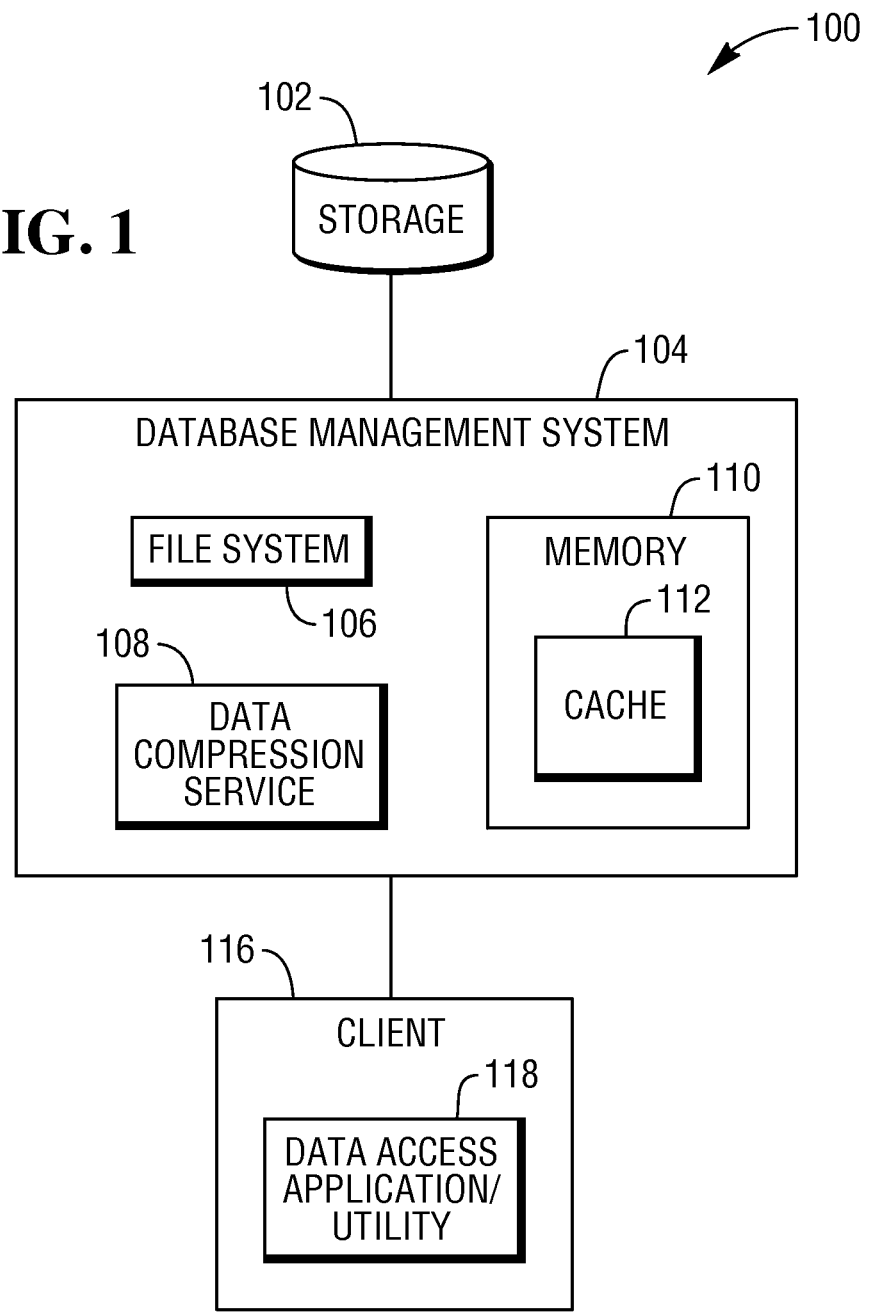
FIG. 1 is a high-level block diagram of a database system employing data compression.

FIG. 1 is a block diagram of a database system employing data compression. The example system 100 includes a storage device 102, a database management system 104, and a client computing device 116.

The storage device 102, in some embodiments, is a hard disk resident on a computing device and can be accessed by the database management system 104. In some embodiments, the database management system 104 and the storage device are located on the same computing device, such as a server computer. In other embodiments, the storage device 102 includes one or more computing devices such as a storage server, a storage area network, or another suitable device.

The client 116, in some embodiments, is a client computer and includes a data access application or utility 118. The client 116 is communicatively coupled to the database management system 104 and may submit queries to and receive query results from the database management system 104.

The database management system 104, in typical embodiments, is a relational database management system. The database management system includes a file system 106 and a memory 110.

The memory 110 is a memory that is resident on a computing device on which the database management system 104 operates. The memory 110 is illustrated within the database management system 104 merely as a logical representation.

The memory 110 includes a cache 112 that holds transient data under control of the file system 106. Data written from the database management system 104 to storage device 102 is first written to the cache 112 and eventually is flushed from the cache 112 after the file system 106 writes the data to the storage device 102. Also, data retrieved from the storage device 102 in response to a query, or other operation, is retrieved by the file system 106 to the cache 112.

The database management system 104 includes a file system. The file system 106 typically manages data blocks that contain one or more rows of a single table. In some such embodiment, the file system 106 maintains the cache 112 in the memory 110. The cache 112 holds data blocks that have been loaded from disk or written by the database management system 104. Requests, or queries, for rows within a table are satisfied from data blocks maintained within the cache 112. Thus, when a query is made against the database, the database management system 104 identifies the relevant rows from relevant tables, and requests those rows from the file system 108. The file system 108 reads the data blocks containing those rows into cache 112. The database management system performs the query against the row or rows in the cache 112.

In some embodiments, data stored in the database may be compressed. In some such embodiments, the data stored in the database is compressed by a data compression service 108 of the database management system 104 before it is presented to the file system, and decompressed as required by the execution of a SQL request.

Patent application Ser. No. 13/414,768, referenced above, and incorporated by reference herein, describes a data compression scheme, referred to as Compression Algorithms with Multiple Small Encoding Tables (CAMSET). CAMSET employs multiple encoding tables, each designed for encoding a subset of character data, such as numeric data, uppercase letters, lowercase letters, Latin, or UNICODE data, to perform compressions and decompression of character data.

The compression solution described below expands upon the CAMSET compression algorithm to not only permit use of a greater number of encoding tables, but to also allow defining new encoding tables on the fly, accommodating multiple different compression algorithms and automatically choosing a suitable one for specific input data.

The CAMSET compression scheme utilized a table code consisting of four bits to identify up to eight small encoding tables. Depending upon the number of bits n used to represent the table code, up to $2^n$ total number of encoding tables can be supported. In the initial implementation of CAMSET, up to sixteen encoding tables can be supported utilizing a four bit table code. This number is too small to support predefining encoding tables for special languages and usages, as shown in the sample encoding tables illustrated in FIG. 2. As shown in FIG. 2, both 4-bit and 5-bit encoding table IDs are used to identify encoding tables. During data compression using encoding tables 0 through 7, the table ID is written into the compressed form using four bits, with the first bit always as '0', while during compression using encoding tables 9 through 23, the ID is written into compressed form using five bits, with the first bit set to '1'. This approach allows the support of eight additional encoding tables over the sixteen encoding tables supported by the initial implementation of CAMSET, accommodating the expansion needed to support predefining encoding tables for special languages and usages, and leaving additional table IDs for future use. As an example, the encoding tables can be expanded as shown in the table of FIG. 2. As described below and shown in FIG. 2, one of the twenty-four table ID codes, code 22, is set aside for definable tables; and another, code 23, is set aside for accommodating different compression algorithms.

Figure 3C:
FIG. 3C provides an example Lowecase English letters encoding table, identified as Encoding Table ID 2 in the table of FIG. 2, for use in compressing lowercase alphabetic data in accordance with the present invention.

FIGS. 3A, 3B, and 3C, illustrate three sample encoding tables from the table of FIG. 2. The sample encoding tables include a digits encoding table shown in FIG. 3A and identified by encoding table ID 0 in the table of FIG. 2, an uppercase English letter encoding table shown in FIG. 3B and identified by encoding table ID 1 in the table of FIG. 2, and a lowercase English letter encoding table shown in FIG. 5C and identified by encoding table ID 2 in the table of FIG. 2.

The digits encoding table shown in FIG. 3A, is used to encode the numerals 0 through 9, shown in the column labeled "Character". Since there are only ten different digits, only four bits are needed for each element in this table, as shown in the column labeled "Bits". However, there are sixteen possible combinations formed by four bits. Thus, this encoding table also includes five popular punctuation characters and a table stop indicator "1111". The inclusion of popular punctuation characters (space, "-", ".", "/", ":") helps reduce table switch overhead caused by punctuations. A table stop indicator, consisting of a bit pattern of all 1's in each encoding table in the described embodiment, is used to indicate the end of a run of characters encoded by the particular encoding table.

The uppercase English letter encoding table and lowercase English letter encoding table, shown in FIGS. 3B and 3C, respectively, require the use of five bits to encode the twenty-six letters of the alphabet. As there are thirty-two possible combinations formed by five bits, leaving six combinations unused for letter encoding, the upper and lower English letter encoding tables also include the five popular punctuation characters and a table stop indicator "1111" which were included in the digit encoding table shown in FIG. 3A.

Encoding table IDs 3 through 14 identify several other encoding tables used by the enhanced CAMSET compression scheme, and encoding table IDs 15 through 21 provide for the addition of further encoding tables to the compression scheme.

Encoding table ID code 22 allows definition of new encoding tables on the fly. Given the limited coverage of the predefined encoding tables, the ability to define new encoding tables on the fly boosts the power of the compression capability. For example, normally Chinese characters in a sequence jump from one Unicode block to another relatively frequently, so it is not efficient to occupy any predefined encoding table code for Chinese characters. However, if the specific data includes a significant number of Chinese characters in a sequence from the same Unicode block, defining a new table for this block would enable the encoding of each character in this sequence by using only one byte instead of two bytes.

Table ID code 23 allows for the use of different compression algorithms. There are a variety of compression algorithms with different compression capabilities and applicability. For example, UTF8 is good for data that is defined as Unicode but contains mainly US-ASCII; Standard Compression Scheme for Unicode (SCSU) is good for data that uses mostly characters from one or a small number of language character blocks; Lempel-Ziv (ZLIB) and Huffman are very good at compressing general data that is long enough, but they are associated with a significant data structure overhead and expensive CPU cost; Run Length Encoding is good for sorted data with highly repeated values; and BOCU is good when if there is a need to preserve ordering of the original data in the compressed form. Data analysis can help determine whether it is preferable to compress input data using CAMSET or a different algorithm. In FIG. 2, table ID code 23 is set aside for indicating the use of a compression algorithm other than CAMSET.

Just as the original CAMSET is not just one single algorithm, but a family of algorithms based on multiple encoding tables, the expanded CAMSET (ECAMSET) described herein is a further expanded family of algorithms.

Referring now to the high-level flowchart illustrated in FIG. 4, one possible implementation of the enhanced compression scheme will be described. The process for compressing character data begins with the receipt of uncompressed character data string 401. Uncompressed character data string 401 may comprise a lengthy sequence of characters of a number of shorter length substrings having different alphabets. In step 402 the length of the input data stream is determined. If the data input string is long, e.g., ≥500 characters, a general purpose compression algorithm is selected for data compression, as illustrated in steps 410 through 430. The data input string is analyzed to determine the nature of the data string in step 410; an appropriate general purpose compression algorithm for the data based upon the analysis performed in step 410, e.g., ZLIB, is selected in step 420; and the input data string is compressed using the selected purpose compression algorithm in step 430.

If data input string 401 is determined to be of shorter length in step 402, the data is compressed using ECAMSET encoding tables as shown in steps 440 through 460. For each substring included within the input data stream, the alphabet, e.g., numeric, uppercase letters, lowercase letters, Latin, Unicode, etc. is determined in step 440. Based upon the alphabet observed, the encoding table to be used for compression is selected in step 450. Compression of the character data in accordance with the selected encoding table is performed in step 460.

In general, compression requires a careful analysis of the uncompressed input data string 401, dividing it into substrings. Each substring must be encodable by a single table. Although different strategies may be used to select encoding tables, one way to divide the string into substrings is a greedy algorithm. The greedy algorithm scans through the source string. When presented with a character, it determines the smallest encoding table that includes that character. If that encoding table is currently being used, the character is simply encoded using that table. Otherwise, the current substring is terminated, and a new substring started based on this optimal encoding table.

The data when compressed using the encoding tables is composed of a sequence of segments for every continuous series of characters that belong to the same encoding table. The segments consist of an encoding table ID, the encoded characters, and the table stop indicator, as shown below:

| Encoding Table ID | Encoded characters | Table Stop Indicator |
| --- | --- | --- | where:
Encoding Table ID is four or five bits and indicates which encoding table is used for this series of characters.
Encoded characters are the bits from the encoding table for this series of characters that belong to the same encoding table identified by Encoding Table ID.
Table Stop Indicator is the highest value (all 1s) in each table, which is not used for encoding any character, e.g., in the digit encoding table of FIG. 3A, the table stop indicator is 0xF, and in the uppercase and lowercase English encoding tables shown in FIGS. 3B and 3C, respectively, the table stop indicator is 0x1F.

An Encoded characters segment may be prefixed with length if the encoding table is a special language table, i.e., tables identified by table IDs 9 through 14 in FIG. 2, or may be prefixed with length and block ID if the encoding table ID indicates it is a definable table, identified by encoding table ID 22 in FIG. 2.

If a compression algorithm other than ECAMSET is chosen, as shown by steps 410 through 430, there will be only one sequence of the above segments for all the characters in the input string, hence there will be no Table Stop Indicator. Encoding Table ID will be set to 0x0E. The following first 4 bits will be set to indicate the selected algorithm, e.g., 0x00 for ZLIB. The rest will be the output from the selected compression algorithm. So the sequence will be 0xE0||ZLIB (the input string).

If ECAMSET is chosen for data compression, as shown in steps 440 through 460, characters will be encoded by using appropriate encoding tables, predefined or definable tables. As there are overlapping encoding tables, many characters can be encoded by more than one encoding tables, the following algorithm selects the appropriate encoding table based on the context.

Figure 5:
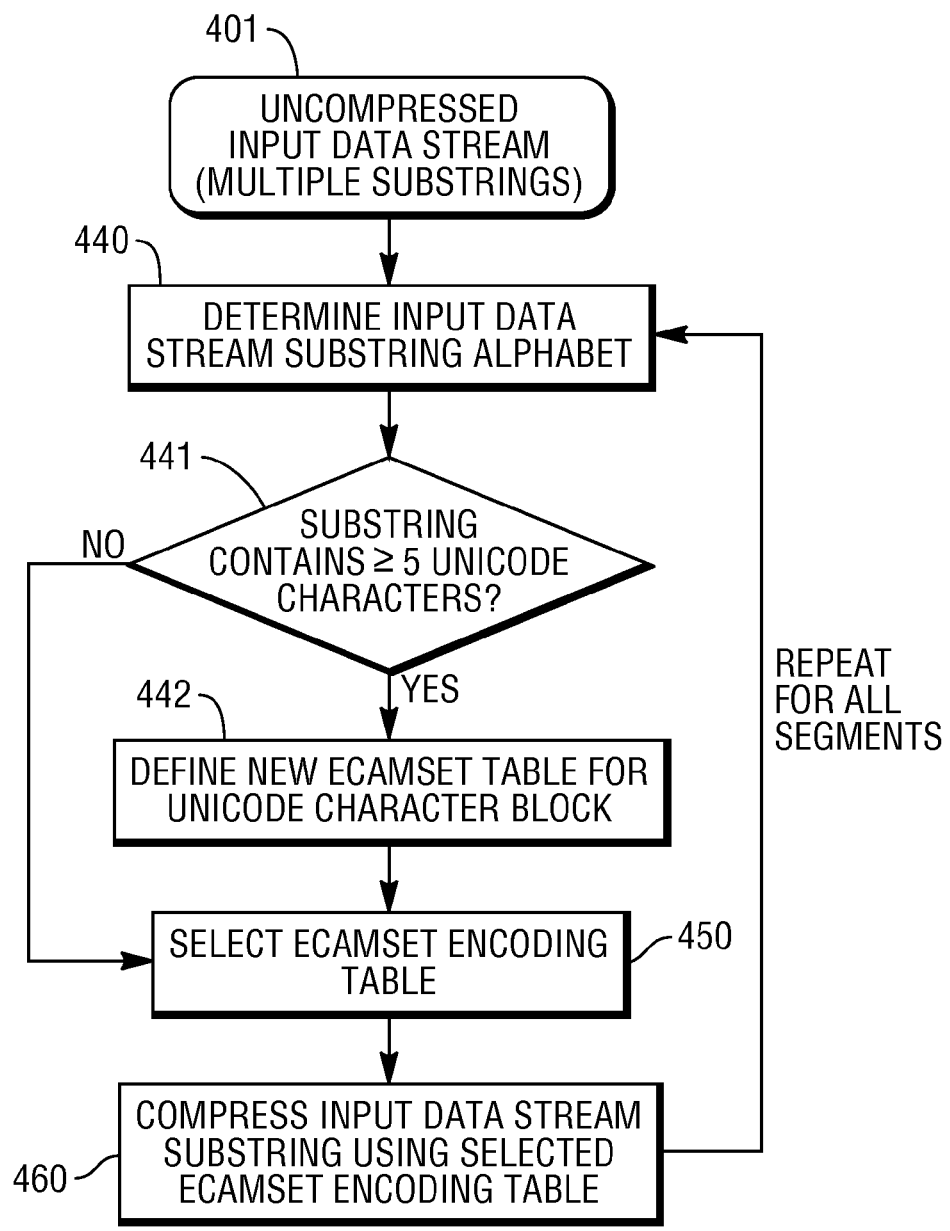
FIG. 5 is flow chart illustrating a process for defining an encoding table on-the-fly during data compression in accordance with the present invention.

The system may also create a new ECAMSET encoding table when one is not available, as shown in FIG. 5. Referring to FIG. 5, the process for compressing character data using ECAMSET begins with the receipt of uncompressed character data string 401. Uncompressed character data string 401 will typically consist of a number of substrings having different alphabets. For each one of these substrings, the alphabet, e.g., numeric, uppercase letters, lowercase letters, Latin or Unicode, is determined in step 440. When it is determined that the substring comprises five or more unicode characters, the system will create a new ECAMSET table from the characters contained within the substring, as shown in step 442. The encoding table to be used for compression, a pre-existing table or the table defined in step 442, is selected in step 450. Compression of the character data in accordance with the selected encoding table is performed in step 460.

A more detailed example of the enhanced compression scheme described above is provided by the pseudo-code provided below. This pseudo-code provides a more comprehensive illustration of the logical steps used for encoding each character, Char, in an input string using the enhanced compression scheme illustrated in FIGS. 4 and 5 and the sample encoding table assignments in FIG. 2. The sample code utilizes all the features of CAMSET including extensions for selecting an encoding table: uses single character look ahead; always tries to use the smallest encoding table, does not switch to a smaller table unless it will potentially be used to encode at least two characters; actively searches for worthwhile definable tables; and quotes an isolated Latin/Unicode character using 0x0C for Latin or 0x0D for Unicode. Key terminology utilized within the pseudo-code listing provided below includes:

Char—the character that is being considered to be encoded in the input string of characters;

Next—the character that appears right after Char;

CurrentTable—the encoding table that is in effect before encoding Char;

Table (Char)—the function that returns the smallest table that contains the input character Char;

CommonTable (Char1, Char2)—the function that returns the smallest table that contains both input characters Char1 and Char2; and BlockID (Char)—the function that returns the high byte value of the input character Char's Unicode code point, indicating which Unicode block Char belongs to.

Psuedo-code for compressing input data string:

1. If CurrentTable=NULL
   1.1 Look ahead one char to determine how to proceed.
   1.2 If Table (Char)⊆Table(Next), start Table (Next) as CurrentTable
      1.2.1 If CurrentTable∈SpecialLanguageTables, look ahead and count until the end of this series of characters that belong to the same encoding table or the count reaches 16 if it is a CJKHK sequence otherwise until the count reaches 256 if it is a sequence in other special language, encode the length in 4 bits for the CJKHK sequence otherwise encode the length as a byte integer, encode all the characters and then stop the CurrentTable.
      1.2.2 Else encode both Char and Next.
   1.3 Else if Table (Char)⊃Table(Next), switch to Table (Char), encode only Char.
   1.4 Else (i.e., Table (Char)∩Table (Next)=∅)
      1.4.1 If CommonTable (Char, Next)=Letters, start Letters table, encode both Char and Next
      1.4.2 Else if CommonTable (Char, Next)=Latin, start Latin table and encode Char only
      1.4.3 Else if BlockID (Char)=BlockID (Next), look ahead, if there are more than five characters in the same block in a row, start a definable table for this block to encode up to 16 characters and the length, i.e., the total number of characters being encoded using this definable table.
      1.4.4 Else if Char∈Latin and Next∉Latin, quote Char as Latin, reset CurrentTable to NULL.
      1.4.5 Else if Char∉Latin
         1.4.5.1 If Table(Next)≠Unicode, quote Char as Unicode.
         1.4.5.2 Else start the Unicode table, encode Char only.
2. If CurrentTable=Table (Char), continue using CurrentTable to encode Char.
3. Else if CurrentTable⊃Table (Char)
   3.1 If CurrentTable=Letters, continue using CurrentTable to encode Char.
   3.2 Otherwise look ahead one character to determine whether to continue using CurrentTable or switch to a smaller table.
      3.2.1 If Table (Char)=Table (Next), stop the current table, switch to Table (Char), encode both Char and Next.
      3.2.2 Else if Table (Char)⊃Table (Next), stop the current table, switch to Table (Char), encode only Char.
      3.2.3 Else if Table (Char)⊂Table (Next)
         3.2.3.1 If CurrentTable=Table (Next), continue using CurrentTable to encode both Char and Next
         3.2.3.2 If CurrentTable⊃Table (Next), stop CurrentTable, switch to Table (Char), encode both Char and Next
         3.2.3.3 Else if CurrentTable⊂Table (Next), continue using CurrentTable to encode only Char.
      3.2.4 Else (i.e., Table (Char)∩Table (Next)=∅)
         3.2.4.1 If CurrentTable=CommonTable (Char, Next)
            3.2.4.1.1 if CurrentTable=Letters, continue CurrentTable, encode both Char and Next
            3.2.4.1.2 Else continue CurrentTable, encode only Char.
         3.2.4.2 Else if CurrentTable⊃CommonTable (Char, Next)
            3.2.4.2.1 If CommonTable (Char, Next)=Letters, stop CurrentTable, switch to Letters table, encode both char and next.
            3.2.4.2.2 Else if CommonTable (Char, Next)=Latin, stop CurrentTable, switch to Latin table, encode char only.
         3.2.4.3 Else if CurrentTable⊂CommonTable (Char, Next), continue CurrentTable, encode Char only.
4. Else if CurrentTable⊂Table (Char) or CurrentTable∩Table (Char)=∅, stop current table and go to Step 1.

The above algorithm searches for worthwhile definable tables. In the above algorithm, when CurrentTable is the Unicode table, the routine continues to count the number of characters that belong to the same block, i.e., having the same high byte value, in a row. When the count of the number of characters reaches a threshold, e.g., 5, (why 5? 16 (table stop)+5 (definable table)+4 (length)+8 (Block ID)+8*x<16*x=>x>5), the routine continues searching forward until reaching the end or a character not in the same block, or the count reaches 16 (if using 4 bits to encode the length). The total number of characters in the same block are recorded, then routine moves backward to stop the current table, and a new table is defined for this Unicode block. For example, in case 6 Chinese characters U+4E01, U+4E02, U+4E03, U+4E04, U+4E05, 0x4E06 (in the same block 4E) are found in a row, the encoding Table ID will be 5 bits '11110', followed by 8 bits '0100 1110' for the high byte specifying the Unicode block 4E, followed by 4 bits length=6 as '0110', then followed by the low byte value of each character, putting together it will be '11110 0100 1110 0110 0000 0001 0000 0002 0000 0003 0000 0004 0000 0005 0000 0006'.

The above algorithm will also quote an isolated Latin or Unicode character. When CurrentTable is Latin or Unicode, the routine counts the number of characters that have been encoded in the current segment. Before stopping CurrentTable, the routine changes to quote the isolated Latin or Unicode character in case the Latin sequence contains only 2 elements or the Unicode sequence contains only 3 elements.

Note that general punctuations and symbols (U+2000~20FF) may be encoded along with other Unicode characters in the sequence if CurrentTable=Unicode, otherwise quoted using the dedicated table ID 7.

The following are some examples using the above sample algorithm of ECAMSET and comparisons with UTF-16, UTF-8, ZLIB, SCSU and the original CAMSET.

Example 1

US-ASCII string: "CA 92127-1046". The compressed value remains the same as the output of the Sample Algorithm of the original CAMSET compression scheme.

| Content | Value | Length in bits |
|---|---|---|
| Encoding Table ID | 0x01 | 4 |
| "CA" | 0x02001A | 15 |
| Table Stop Indicator | 0x1F | 5 |
| Encoding Table ID | 0x00 | 4 |
| "92127-1046" | 0x09020102070B01000406 | 40 |
| Table Stop Indicator | 0x0F | 4 (optional) |

The total length of the compressed value is 72 bits, which is 9 bytes. This compares with 13 bytes for Latin or Unicode UTF-8 or SCSU, 26 bytes for Unicode UTF-16, and longer for ZLIB. Notice the last Table Stop Indicator can be omitted, which could potentially save a byte further in many situations.

Example 2

German string: "Öl fließt". This is an example string of 9 characters with Unicode code points as "00D6 006C 0020 0066 006C 0069 0065 00DF 0074", totally 18 bytes in UTF-16, which is illustrated for SCSU as 9 bytes in the compressed form. In the Expanded CAMSET compression scheme, it will be also 9 bytes (actually 71 bits in total, one bit less than SCSU) as follows.

| Content | Value | Length in bits |
|---|---|---|
| Encoding Table ID | 0x0C Quote a Latin char | 4 |
| "Ö" | 0xD6 | 8 |
| Encoding Table ID | 0x02 Lowercase Letters | 4 |
| "l flie" | 5 bits for each of 6 letters | 30 |
| Table Stop Indicator | | 5 |
| Encoding Table ID | 0x04 Latin Table | 4 |
| "βt" | 8 bits for each of 2 elements | 16 |

Example 3

Latin and Cyrillic sentence. The following example string has Unicode code points as "201c 004D 006F 0073 0063 00 6F 0077 201D 0020 0069 0073 0020 041C 043E 0441 043A 0432 0430", totally 19 characters, 38 bytes in UTF-16. It is illustrated for SCSU as follows, 22 bytes in total[2, 3].

The compressed value by the sample algorithm of strategy and the sample encoding tables of the expanded CAMSET will be 21 bytes (one byte less than SCSU) as follows.

| Content | Value | Length in bits |
|---|---|---|
| Encoding Table ID | 0x07 Quote a general punctuation | 4 |
| The left curly double quotation mark """ | 0x1C | 8 |
| Encoding Table ID | 0x03 English Letters | 4 |
| "Moscow" | 6 bits for each of 6 letters | 36 |
| Table Stop Indicator | | 6 |
| Encoding Table ID | 0x07 Quote a general punctuation | 4 |
| The left curly double quotation mark """ | 0x1D | 8 |
| Encoding Table ID | 0x02 Space is included in Lowercase Letters table | 4 |
| " is " | 5 bits for each of 4 elements (2 spaces and 2 lowercase letters | 20 |
| Table Stop Indicator | | 5 |
| Encoding Table ID | 0x12 | 5 |
| "МОСКВА" | 8 bits for length and 8 bits for each of 6 elements | 56 |
| Encoding Table ID | 0x00 "." is included in Digits Table | 4 |
| "." | 4 bits for one element | 4 |

Example 4

Japanese text. The following text consists of a short piece of text found in a Japanese news story, totally 116 characters, 232 bytes in UTF-16[2].

♪リンゴ可愛いや 可愛いやリンゴ。半世紀も前に流行した「リンゴの歌」がび

ったりするかもし れない。米アップル コンピュータ社のパソコン「マック（マッ

キントッシュ）」を、こよなく愛する 人たちのことだ。「アップル信者」なんて

言い方まである。

| " | M | o | s | c | o | w | " | | i | s | | M | O | C | K | B | A | . |
|---|---|---|---|---|---|---|---|---|---|---|---|---|---|---|---|---|---|---|
| 05 | 1C | 4D | 6F | 73 | 63 | 6F | 77 | 05 | 1D | 20 | 69 | 73 | 20 | 12 | 9C | BE | C1 | BA | B2 | B0 | 2E |

The Unicode code points are:

| | | | | | | | | | | | |
|---|---|---|---|---|---|---|---|---|---|---|---|
| 3000 | 266A | 30EA | 30F3 | 30B4 | 53EF | 611B | 3044 | 3084 | 53EF | 611B | 3044 | 3084 |
| 30EA | 30F3 | 30B4 | 3002 | 534A | 4E16 | 7D00 | 3082 | 524D | 306B | 6D41 | 884C | 3057 |
| 305F | 300C | 30EA | 30F3 | 30B4 | 306E | 6B4C | 300D | 304C | 3074 | 3063 | 305F | 308A |
| 3059 | 308B | 304B | 3082 | 3057 | 308C | 306A | 3044 | 3002 | 7C73 | 30A2 | 30C3 | 30D7 |
| 30EB | 30B3 | 30F3 | 30D4 | 30E5 | 30FC | 30BF | 793E | 306E | 30D1 | 30BD | 30B3 | 30F3 |
| 300C | 30DE | 30C3 | 30AF | FF08 | 30DE | 30C3 | 30AD | 30F3 | 3008 | 30C3 | 30B7 | 30E5 |
| FF09 | 300D | 3092 | 3001 | 3053 | 3088 | 306A | 304F | 611B | 3059 | 308B | 4EBA | 305F |
| 3061 | 306E | 3053 | 3068 | 3060 | 3002 | 300C | 30A2 | 30C3 | 30D7 | 30EB | 4FE1 | 8005 |
| 300D | 306A | 3093 | 3066 | 8A00 | 3044 | 65B9 | 307E | 3067 | 3042 | 308B | 3002 | |

In SCSU it will be 178 bytes. It will be 171 bytes in the ECAMSET, with a few segments at the front of the compressed form shown in the following table.

| Content | Value | Length in bits |
|---|---|---|
| Encoding Table ID | 0x08 Quote a Unicode | 5 |
| Ideographic space | 0x3000 | 16 |
| Encoding Table ID | 0x08 Quote a Unicode | 5 |
| "♪" | 0x266A | 16 |
| Encoding Table ID | 0x16 CJKHK | 5 |
| "リンゴ" | 4 bits length and 8 bits each of 3 elements | 28 |
| Encoding Table ID | 0x08 Quote a Unicode | 5 |
| "可" | 0x53EF | 16 |
| Encoding Table ID | 0x08 Quote a Unicode | 5 |
| "愛" | 0x611B | 16 |
| Encoding Table ID | 0x16 CJKHK | 5 |
| "いや" | 4 bits length and 8 bits each of 2 elements | 20 |
| ... | | |

Figure 6B:
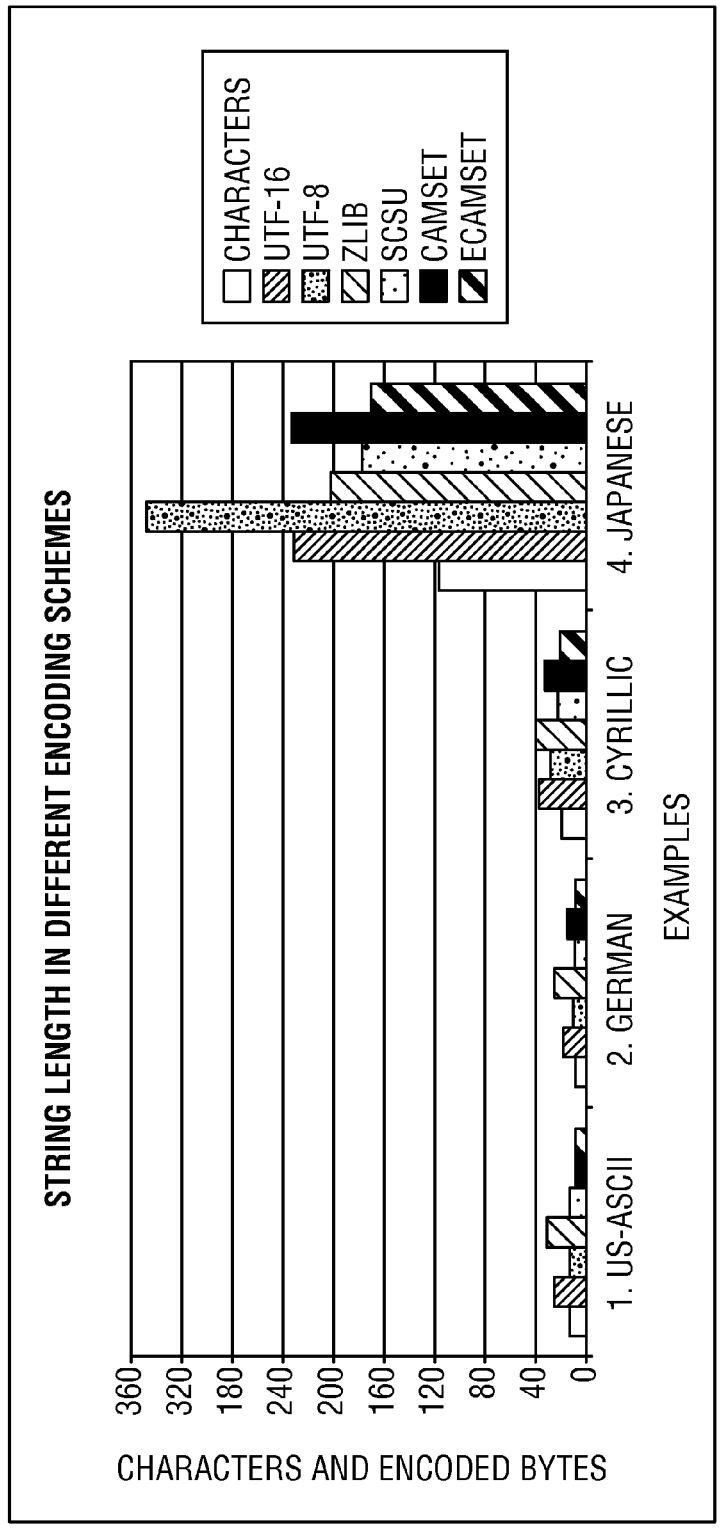
FIG. 6B is a graph corresponding to the table of FIG. 6A summarizing the results of several compression examples utilizing the compression techniques of the present invention.

The table of FIG. 6A and corresponding chart of FIG. 6B summarize the above examples, including the number of characters of each example string and the number of bytes in different encodings.

This invention expands the compression techniques taught in patent application Ser. No. 13/414,768 (CAMSET) to allow defining new encoding tables on the fly and leveraging different compression algorithms, providing a family of more flexible and powerful compression algorithms than the original CAMSET. The expansions make it more complicated than the original CAMSET, however it remains requiring only a single pass through the data. It is able to compress both Latin and Unicode data, while SCSU and BOCU cannot compress Latin data. It is able to achieve good compression for short as well as long strings, while general purpose compression algorithms such as Lempel-Ziv and Huffman don't compress short strings well.

Test results with production data in several industries, such as communication, finance and retail from all over the world show the simple sample algorithm of the original CAMSET achieved about 20~40% compression rate on Latin data, about 30~70% on Unicode data, almost always higher or much higher than other compression algorithms including gzip (i.e., Lempel-Ziv). ECAMSET is believed to be able to obtain compress performance equal or better than CAMSET, as shown in the above examples.

Figure 4:
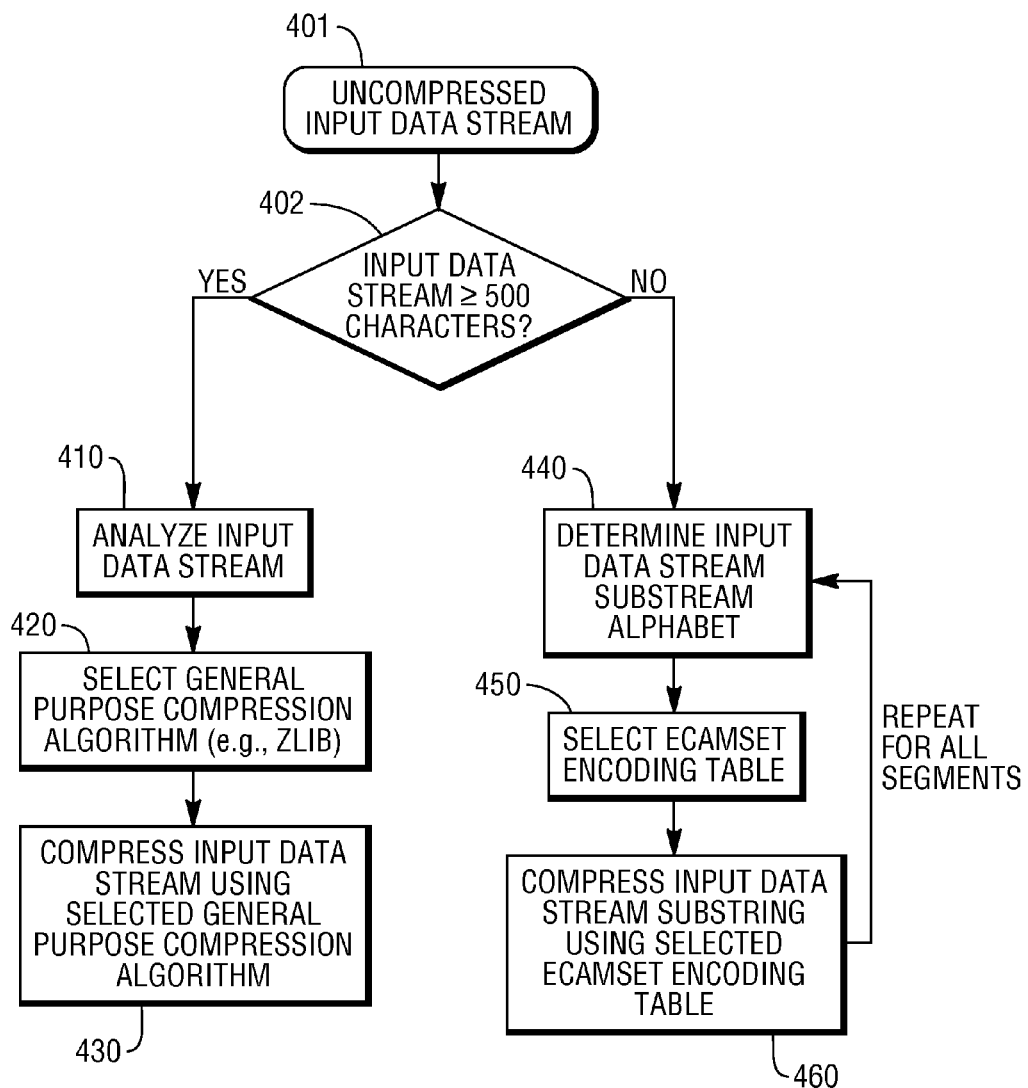
FIG. 4 is simple flowchart illustrating a process for compressing data in accordance with the present invention.

Instructions of the various software routines discussed herein, such as the methods illustrated in FIGS. 4 and 5, are stored on one or more storage modules in the system shown in FIG. 1 and loaded for execution on corresponding control units or computer processors. The control units or processors include microprocessors, microcontrollers, processor modules or subsystems, or other control or computing devices. As used here, a "controller" refers to hardware, software, or a combination thereof A "controller" can refer to a single component or to plural components, whether software or hardware.

The foregoing description of the invention has been presented for purposes of illustration and description. It is not intended to be exhaustive or to limit the invention to the precise form disclosed.

Additional alternatives, modifications, and variations will be apparent to those skilled in the art in light of the above teaching. Accordingly, this invention is intended to embrace all alternatives, modifications, equivalents, and variations that fall within the spirit and broad scope of the attached claims.

What is claimed is:

1. A method for compressing character data, the method comprising the steps of:
    maintaining within a computer system a plurality of encoding tables corresponding to a plurality of character alphabets;
    receiving, by said computing system, an input stream containing uncompressed character data;
    determining, by said computing system, the length of said input string containing uncompressed character data;
    when the length of said input stream exceeds a predefined length value, compressing, by said computing system, said uncompressed character data using a general purpose compression algorithm; and
    when the length of said input stream does not exceed said predefined length value, selecting, by said computing system, an encoding table from said plurality of encoding tables, said selected encoding table corresponding to the character alphabet of said uncompressed character data contained within said input stream, and compressing, by said computing system, said uncompressed character data using said selected encoding table to provide compressed character data.

2. The method for compressing data in accordance with claim 1, wherein said general purpose compression algorithm is selected from the following general purpose compression algorithms:
    Uniform Transformation Format 8 (UTF8);
    Standard Compression Scheme for Unicode (SCSU);
    Lempel-Ziv Compression Scheme (ZLIB);
    Huffman Run Length Encoding; and
    Binary Ordered Compression for Unicode (BOCU).

3. The method for compressing character data in accordance with claim 1, further comprising the step of:
    when the length of said input stream does not exceed said predefined length value, and said plurality of encoding table does not include an encoding table corresponding to the character alphabet of said uncompressed character data, analyzing, by said computing system, said input string to identify a new character alphabet and creating a new encoding table to compress said new character alphabet.

4. A system for compressing data, comprising:
a database management system including a compression service that:
receives an input stream containing uncompressed character data;
determines the length of said input string containing uncompressed character data;
when the length of said input stream exceeds a predefined length value, compresses said uncompressed character data using a general purpose compression algorithm; and
when the length of said input stream does not exceed said predefined length value, selects an encoding table from a plurality of encoding tables corresponding to a plurality of character alphabets, said selected encoding table corresponding to the character alphabet of said uncompressed character data contained within said input stream, and compresses said uncompressed character data using said selected encoding table to provide compressed character data.

5. The system for compressing data in accordance with claim 4, wherein said general purpose compression algorithm is selected from the following general purpose compression algorithms:
Uniform Transformation Format 8 (UTF8);
Standard Compression Scheme for Unicode (SCSU);
Lempel-Ziv Compression Scheme (ZLIB);
Huffman Run Length Encoding; and
Binary Ordered Compression for Unicode (BOCU).

6. The system for compressing data in accordance with claim 4, wherein:
when the length of said input stream does not exceed said predefined length value, and said plurality of encoding table does not include an encoding table corresponding to the character alphabet of said uncompressed character data, said compression service analyzes said input string to identify a new character alphabet and creates a new encoding table to compress said new character alphabet.

7. A non-transitory computer-readable medium having a computer program, for compressing an input string containing uncompressed character data having one of a plurality of alphabets received by a computer system, the computer program including executable instructions that cause said computer system to:
determine the length of said input string;
when the length of said input stream exceeds a predefined length value, compress said uncompressed character data using a general purpose compression algorithm; and
when the length of said input stream does not exceed said predefined length value, select an encoding table from a plurality of encoding tables, said selected encoding table corresponding to the character alphabet of said uncompressed character data contained within said input stream, and compress said uncompressed character data using said selected encoding table to provide compressed character data.

8. The non-transitory computer-readable medium having a computer program for compressing character data having one of a plurality of alphabets received by a computer system in accordance with claim 7, wherein said general purpose compression algorithm is selected from the following general purpose compression algorithms:
Uniform Transformation Format 8 (UTF8);
Standard Compression Scheme for Unicode (SCSU);
Lempel-Ziv Compression Scheme (ZLIB);
Huffman Run Length Encoding; and
Binary Ordered Compression for Unicode (BOCU).

9. The non-transitory computer-readable medium having a computer program for compressing character data having one of a plurality of alphabets received by a computer system in accordance with claim 7, wherein:
when the length of said input stream does not exceed said predefined length value, and said plurality of encoding table does not include an encoding table corresponding to the character alphabet of said uncompressed character data, the program includes executable instructions that cause said computer system to analyze said input string to identify a new character alphabet and create a new encoding table to compress said new character alphabet.

* * * * *